(12) United States Patent
Walker et al.

(10) Patent No.: US 10,873,443 B1
(45) Date of Patent: Dec. 22, 2020

(54) GENERATING LOWER FREQUENCY MULTI-PHASE CLOCKS USING SINGLE HIGH-FREQUENCY MULTI-PHASE DIVIDER

(71) Applicant: Cadence Design Systems, Inc., San Jose, CA (US)

(72) Inventors: Jeremy Walker, San Jose, CA (US); Hiu Ming Lam, San Jose, CA (US); Mohammad Ranjbar, Los Altos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/457,559

(22) Filed: Jun. 28, 2019

(51) Int. Cl.
| | |
|---|---|
| H03M 9/00 | (2006.01) |
| H04L 7/033 | (2006.01) |
| G06F 1/08 | (2006.01) |
| G06F 1/10 | (2006.01) |
| G11C 7/22 | (2006.01) |
| G11C 8/18 | (2006.01) |
| G11C 27/02 | (2006.01) |

(52) U.S. Cl.
CPC .............. *H04L 7/033* (2013.01); *G06F 1/08* (2013.01); *G06F 1/10* (2013.01); *G11C 7/222* (2013.01); *G11C 8/18* (2013.01); *G11C 27/02* (2013.01); *H03M 9/00* (2013.01)

(58) Field of Classification Search
CPC ............ H04L 7/033; G06F 1/08; G11C 7/222
USPC .................................................. 341/100, 101
See application file for complete search history.

(56) References Cited

U.S. PATENT DOCUMENTS

| | | | |
|---|---|---|---|
| 6,125,158 A * | 9/2000 | Carson | H03D 13/003 327/156 |
| 9,124,278 B1 | 9/2015 | Das | |
| 9,160,582 B1 | 10/2015 | Huss et al. | |
| 9,379,846 B1 | 6/2016 | Poplack et al. | |
| 9,470,754 B1 | 10/2016 | Chickermane et al. | |
| 9,606,179 B1 | 3/2017 | Cunningham et al. | |
| 9,647,688 B1 | 5/2017 | Poplack et al. | |
| 9,924,466 B1 | 3/2018 | Leuciuc | |
| 9,940,288 B1 | 4/2018 | Reiss et al. | |
| 2002/0051507 A1 * | 5/2002 | Kiyohiko | H03D 13/004 375/375 |
| 2006/0077082 A1 * | 4/2006 | Shanks | G06K 7/0008 341/120 |
| 2011/0122002 A1 * | 5/2011 | Tsunoda | H03M 9/00 341/101 |

* cited by examiner

*Primary Examiner* — Peguy Jean Pierre
(74) *Attorney, Agent, or Firm* — Foley & Lardner LLP

(57) ABSTRACT

According to certain aspects, the present embodiments are directed generally to data communication systems, and more particularly to generating multi-phase clocks in a SerDes system. Embodiments provide SerDes components and methods that are capable of generating multiple different sampling frequencies for parallelizing serial data from a single high speed clock. These and other embodiments can be implemented with circuits that are relatively small and low-power as compared to conventional approaches.

17 Claims, 7 Drawing Sheets

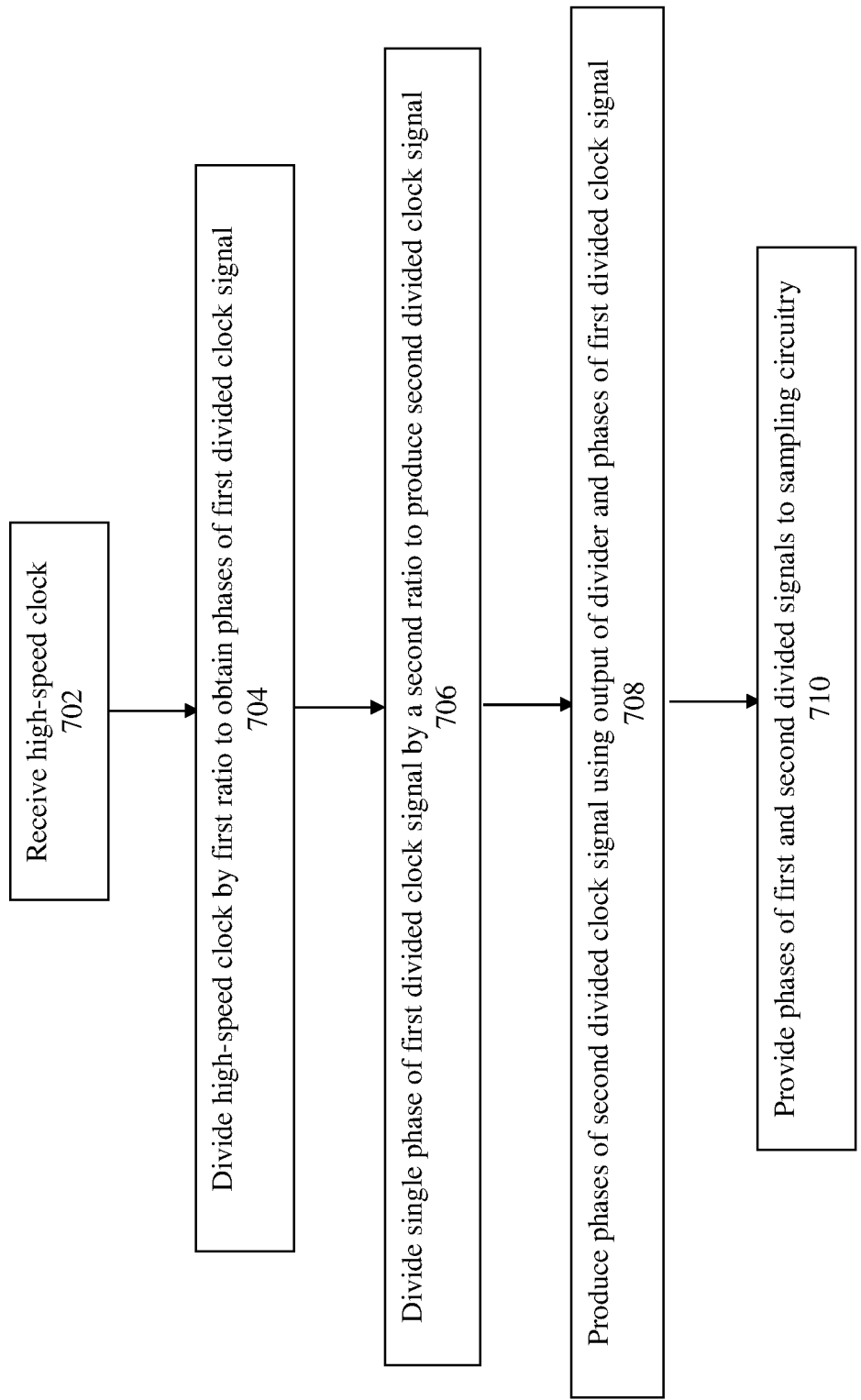

GENERATING LOWER FREQUENCY MULTI-PHASE CLOCKS USING SINGLE HIGH-FREQUENCY MULTI-PHASE DIVIDER

TECHNICAL FIELD

The present embodiments relate generally to data communication systems, and more particularly generating multi-phase clocks in a serializer-deserializer system.

BACKGROUND

As the Internet and other communications networks continue to mature, high volume and high data bit-rate activities such as multimedia streaming and cloud computing are becoming more popular. To accommodate these wide data bandwidth applications, faster network services are required. To facilitate network services, network routers and servers typically include a serializer-deserializer system (SerDes). A SerDes includes a serial data link transceiver. A transceiver includes: (i) a receiver (RX), which receives high speed serial data and parallelizes the serial data into lower frequency, multi-bit data words and (ii) a transmitter (TX) which serializes multi-bit data words into high rate single-bit streams that can be sent over a serial communication channel.

Challenges can arise in the design of SerDes transceivers, for example, when transceivers need to account for multiple different sampling frequencies and phases for parallelizing serial data.

SUMMARY

According to certain aspects, the present embodiments are directed generally to data communication systems, and more particularly to generating multi-phase clocks in a SerDes system. Embodiments provide SerDes components and methods that are capable of generating multiple different sampling frequencies for parallelizing serial data from a single high speed clock. These and other embodiments can be implemented with circuits that are relatively small and low-power as compared to conventional approaches.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 7 is a flowchart illustrating an example methodology according to embodiments.

DETAILED DESCRIPTION

Figure 1:
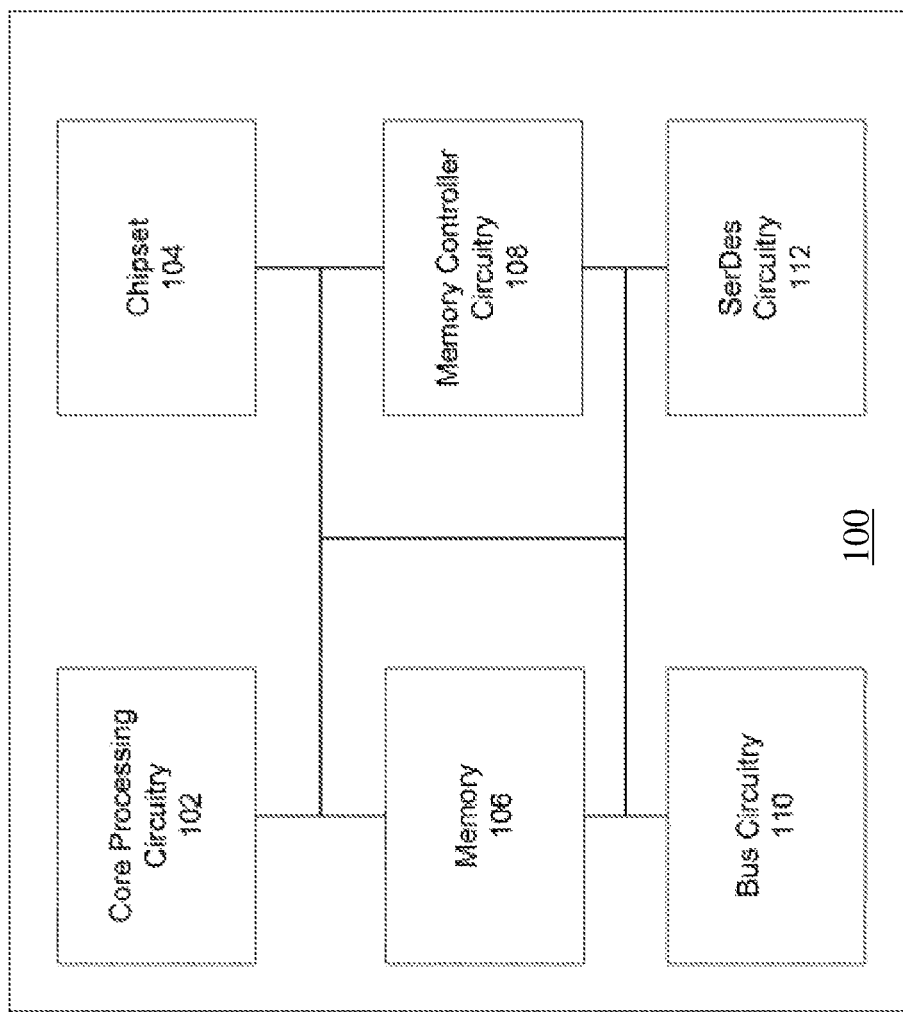
FIG. 1 is a block diagram illustrating an example system having SerDes circuitry in which embodiments can be practiced.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments are directed to SerDes components and methods that provide multiple different sampling frequencies and phases for parallelizing serial data from a single high speed clock that can be implemented with full-swing CMOS circuits which are relatively small and low-power. In these and other embodiments, input capacitance and area are substantially reduced in comparison to conventional approaches. Moreover, the present embodiments are scalable to allow for different sampling frequencies to be added to a design easily.

As set forth above, SerDes components are becoming increasingly common in many microprocessor applications. The trend has involved increasing the number of serial links at higher and higher speeds in smaller geometry processes. This may be necessary in order to provide the data transmission requirements of higher capacity chips that are severely pin limited. A high speed serial link requires data and clock recovery for wired applications such as backplanes, networks and chip to chip communication. Some industry standards for this type of communication include but are not limited to, Peripheral Component Interconnect Express ("PCIe"), Common Electrical Interface ("CEI-6"), 10 Gigabit Attachment Unit Interface ("XAUI") (IEEE 802.3ae), Serial ATA ("SATA"), Fibrechannel, 802.3ap (e.g., 10GBASE-KR) and others. In this way, transfer data rates from 2.5 Gb/s, up to as high as 112 Gb/s are becoming common.

Referring now to FIG. 1, an embodiment of an integrated circuit (IC) 100 in accordance with the present disclosure is shown. The term "integrated circuit", as used in any embodiment herein, may refer to a semiconductor device and/or microelectronic device, such as, for example, an application specific integrated circuit (ASIC), a field programmable gate array (FPGA) and/or a system on a chip (SOC). The specific configuration, arrangement, and components shown in IC 100 are provided merely for exemplary purposes as additional and/or alternative configurations are also within the scope of the present disclosure. More particularly, the principles of the present embodiments can be practiced in SerDes circuitry that can be included in many different devices or circuits other than those similar to the example IC 100, and so the particular details of IC 100 are not important for an understanding of the present embodiments.

In this illustrated example, IC 100 includes core processing circuitry 102, which may include a variety of different processors such as those known in the art. Any suitable processor may be used without departing from the scope of the present disclosure. IC 100 may also include chipset 104. In some embodiments, chipset 104 may include both Northbridge/memory controller hub (MCH) and Southbridge/I/O controller hub (ICH) circuitry. These components may be included within chipset 104 or at any other location within IC 100. IC 100 may also include memory 106, which may be in communication with core processing circuitry 102. Memory 106 may comprise one or more of the following types of memories: semiconductor firmware memory, programmable memory, non-volatile memory, read only memory, electrically programmable memory, random access memory, flash memory (which may include, for example, NAND or NOR type memory structures), magnetic disk memory, and/or optical disk memory. Either additionally or alternatively, memory may comprise other and/or later-developed types of computer-readable memory. In some embodiments, memory 106 may include, for example, 256 KB of two-way level 2 cache. IC 100 may additionally include memory controller circuitry 108 configured to manage the flow of data to and from memory. For example, in some embodiments, memory controller circuitry 108 may include a double-data-rate two synchronous dynamic random access memory (DDR2 SDRAM) controller. IC 100 may further include bus circuitry 110 configured to provide compatibility with a variety of different bus architectures, including, but not limited to, Universal Serial Bus (USB), Serial Advanced Technology Attachment (SATA), Peripheral Component Interface (PCI), PCI-Express and System Management Bus (SMBus).

Figure 2:
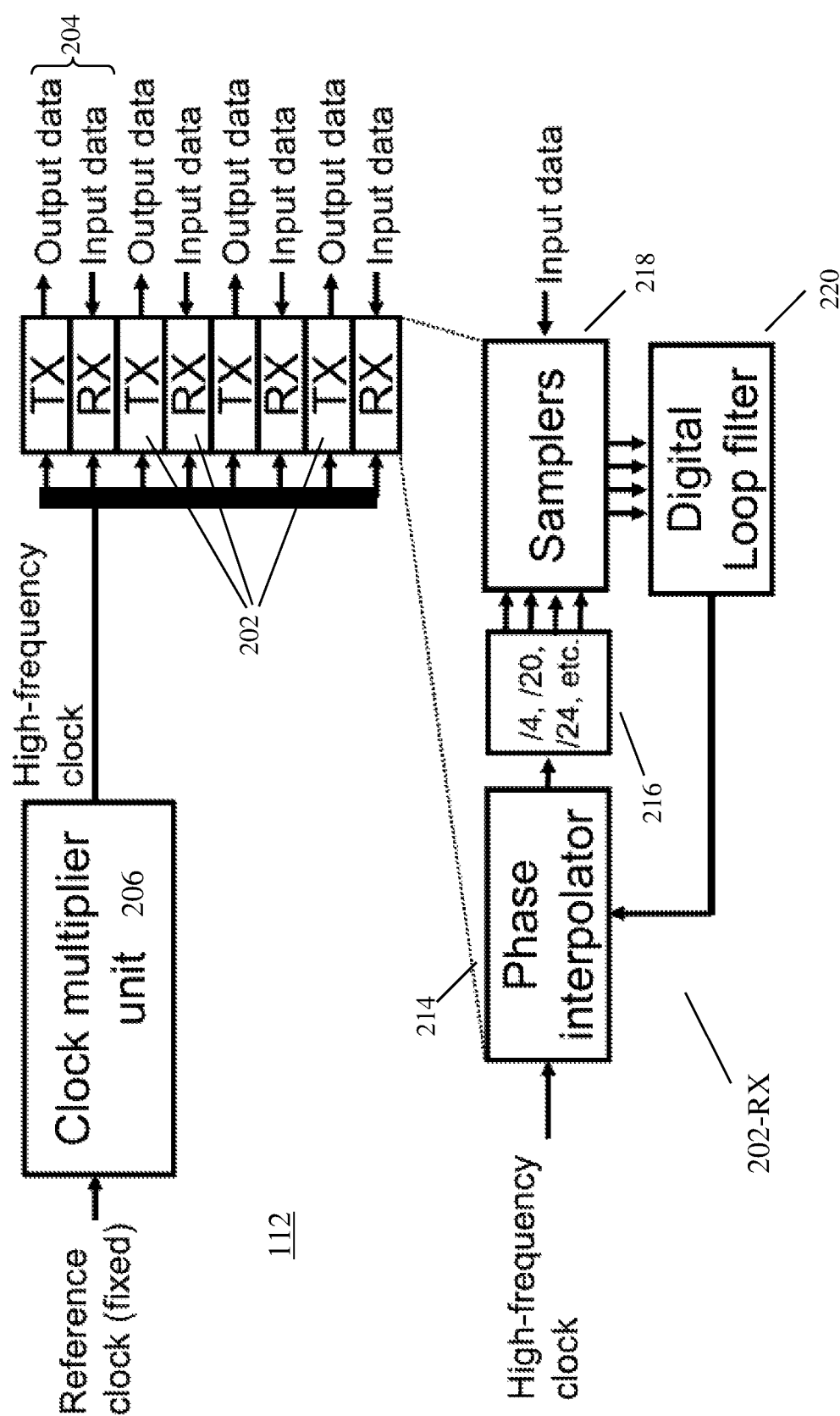
FIG. 2 is a block diagram illustrating certain aspects of generating multiple clocks for a SerDes transceiver.

As further shown in this example, IC 100 may also include SerDes circuitry 112. FIG. 2 illustrates certain aspects of an example implementation of SerDes circuitry 112. As shown in this example, circuitry 112 includes a plurality of transceivers 202, each transceiver 202 including a receiver (RX), which receives high speed serial data from a serial communication channel 204 and parallelizes the serial data into lower frequency, multi-bit data words and a transmitter (TX) which serializes multi-bit data words into high rate single-bit streams that can be sent over the serial communication channel 204.

Each transceiver 202 can require a wide range of data rates which may span orders of magnitude in speed (e.g. 100 Gb/s to 1 Gb/s). Clock multiplier units (CMU) 206 use a single input reference clock to generate a range of frequencies which each RX or TX can use to sample the input or output data. For better power/performance, a narrow range of output frequencies from the CMU 206 is helpful. So the result is that SerDes architectures often employ narrow bandwidth CMUs and may use integer divider circuits within the RX or TX to achieve other rates.

Figure 3:
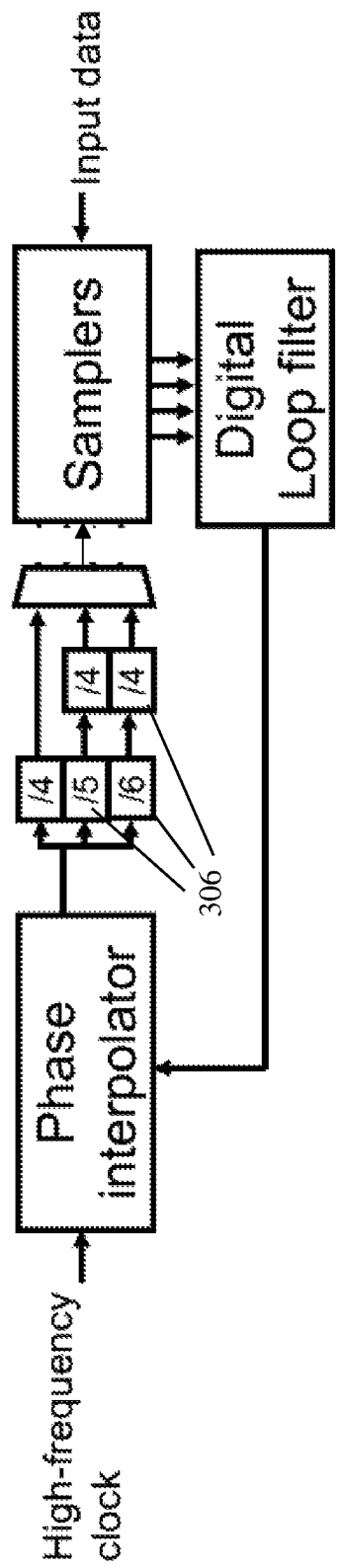
FIG. 3 is a block diagram illustrating further aspects of generating multiple clocks for a SerDes transceiver.

For example, as further shown in FIG. 3, an example receiver 202-RX may employ an architecture where a high-speed phase interpolator 214 produces the necessary phase shift to close the timing loop between clock and data. More particularly, as shown, receiver 202-RX includes samplers 218 that sample the input data stream at the required sampling rates (four different sampling rates in this example). A digital loop filter 220 is used to provide the feedback to phase interpolator 214 so as to keep the phase of the sampling clocks properly aligned with the high-frequency input clock.

As further shown, for samplers 218 to operate at the right frequency, dividers 216 are needed after the interpolation by 214. Moreover, each of these dividers may need to produce multi-phase outputs to provide a higher effective sampling rate (e.g., eight phases of a 1.25 GHz clock are needed to achieve a 10 Gb/s sampling rate). The more unique divide ratio combinations that exist (e.g., to achieve a divide-by-20, a divide-by-5 is combined with divide-by-4, to achieve a divide-by-24, a divide-by-6 is combined with divide-by-4, etc.), the more loading that will be seen by the interpolator 304, and hence the need for more power.

These and other aspects are illustrated in more detail in FIG. 3. As shown in FIG. 3, multiple high-speed dividers 306 are used in parallel to produce the phases needed for sampling. In this example, one parallel divider is a divide-by-4, another is a divide-by-5 combined with a divide-by-4 to achieve a divide-by-20, and another is a divide-by-6 combined with a divide-by-4 to achieve a divide-by-24. These dividers 306 need to be provided in parallel with each other because the division ratios involve prime numbers (e.g., 3, 5, etc.), and so for these ratios they cannot just be built from taking the output of the divide-by-4 and applying further divisions. Because all of these dividers 306 need to operate at the rate of the high frequency clock from unit 206, they are typically constructed from CML circuits which are large and power-hungry, which even further exacerbates the power consumption and other problems of conventional approaches.

Figure 4:
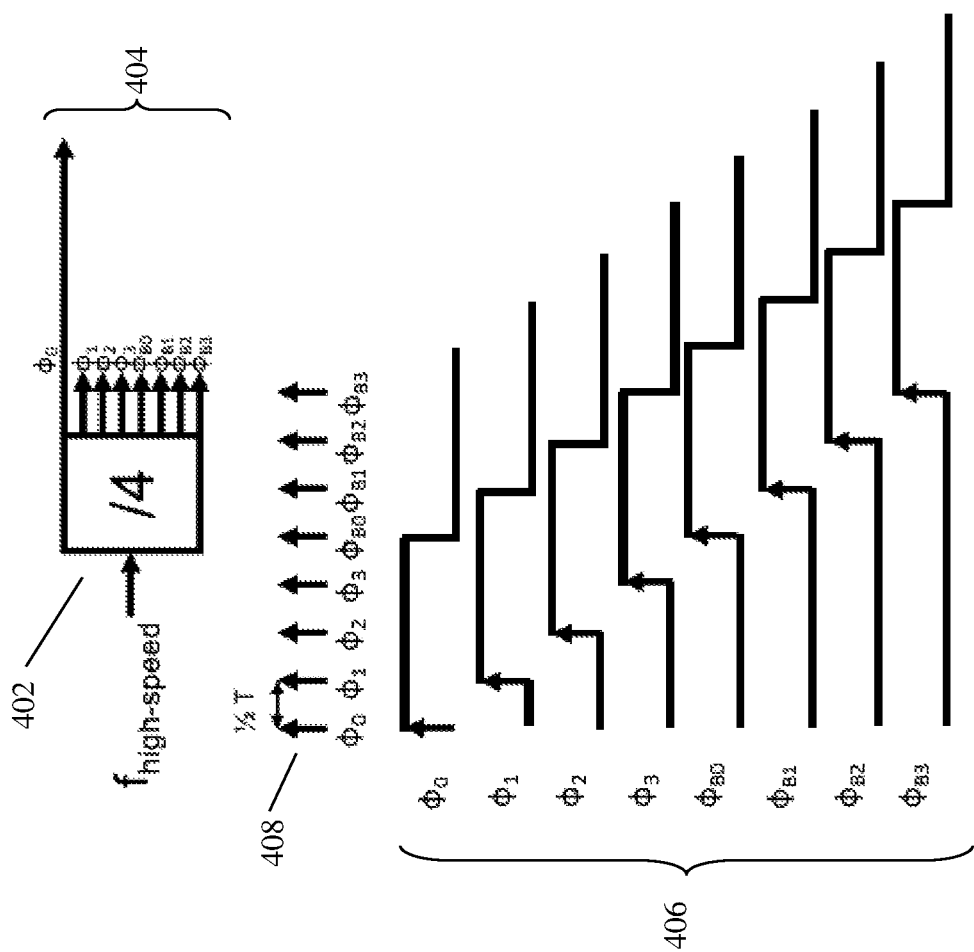
FIG. 4 is a block diagram illustrating aspects of an example circuit for generating multiple clocks according to embodiments.

According to certain aspects, therefore, instead of multiple high-speed divider units in parallel as in the conventional approaches illustrated above, embodiments use a single divider and additional circuitry that outputs all the clock phases that may be needed. FIG. 4 illustrates an example of this approach using a single initial divide-by-4 divider 402. Divider 402 can be implemented in many ways known to those skilled in the art, for example using a chain of four interconnected latches, all clocked at the input high-frequency clock.

Divider 402 produces eight output clocks 404, having waveforms 406 further shown in FIG. 4. As shown by waveforms 406, these eight clocks 404 (denoted in sequence as $\Phi_0, \Phi_1, \Phi_2, \Phi_3, \Phi_{B1}, \Phi_{B2}$ and $\Phi_{B3}$) each have a frequency of one quarter of the input high-frequency clock, and are spaced apart at one half of the period of the high-frequency clock (½ T). These spacings can be based on pulse train 408 (with designations of pulses corresponding to the eight clocks 404 for clarity of illustration), which can be generated from the rising and falling edges of the input high-frequency clock, for example, using techniques and components well known to those skilled in the art. It should be noted that although the present embodiments will be described in connection with an initial divide-by-4 example, other embodiments include using other initial divide ratios such as 2, 3, 5, etc. Moreover, any subsequent divider (e.g., divide-by-5, divide-by-6, etc.) can be used as long as the initial divider (e.g. divide-by-2, 3, 4, 5, etc.) provides output phases that are appropriate for use by the subsequent divider, as will become more apparent from the descriptions below. Those skilled in the art will understand how to implement such embodiments after being taught by this example.

Figure 5:
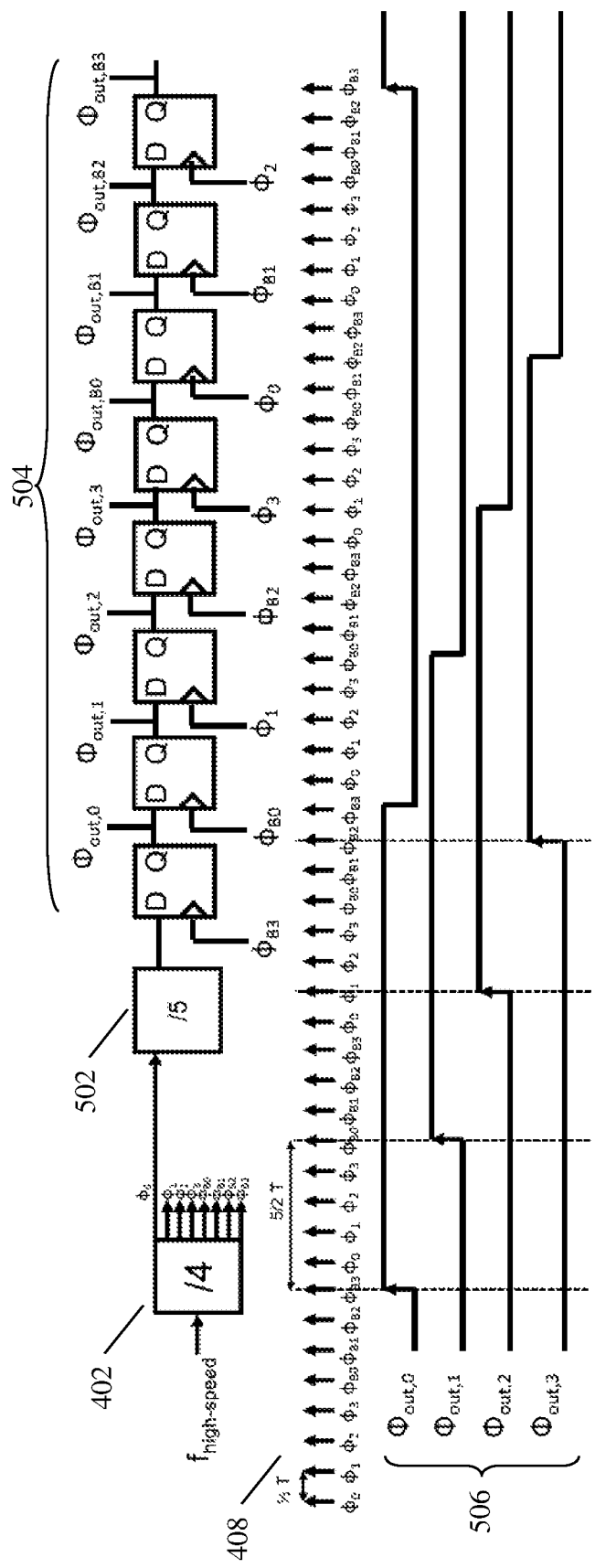
FIG. 5 is a block diagram and a timing diagram illustrating further aspects of multiple clock generation according to embodiments.

According to certain aspects, in addition to producing a desired number of clock phases for the initial clocks at the initially divided one-fourth frequency, some or all of the outputs of divider 402 can be used to generate even lower-frequency clocks. For example, as shown in FIG. 5, a single divide-by-four clock output from 402 can be sent to a subsequent divider 502 (e.g. a divide-by-5 divider in this overall divide-by-20 example) and subsequent phases can be created using a flip-flop delay chain 504. As shown, chain 504 is coupled to receive the single divided output from 502 as well as other of the phases from 402. It should be noted that divider 502 (implemented in many ways known to those skilled in the art, for example using a chain of five interconnected latches) is different from divider 402 in some important respects. In particular, while divider 402 is operating at the PLL frequency associated with the input high speed clock, divider 502 is operating at one-fourth the PLL frequency (e.g., the interconnected latches are being clocked by the phase output of the divider 402, rather than the input high frequency clock). As such, divider 502 can operate at much lower power than divider 402.

As shown in the example of FIG. 5, chain 504 includes eight flip-flops for generating eight output phases of clocks (denoted in sequence as $\Phi_{out,0}$, $\Phi_{out,1}$, $\Phi_{out,2}$, $\Phi_{out,3}$, $\Phi_{out,B0}$, $\Phi_{out,B1}$, $\Phi_{out,B2}$ and $\Phi_{out,B3}$) each having $1/20^{th}$ the frequency of the input high speed clock. Four of the outputs from the first four flops in chain 504 are shown in the waveforms 506. In order to generate the correct spacing of the phases output by chain 504, the individual clocks for the flops in the chain 504 are carefully selected from among the phases output from divider 402. In this divide-by-20 example, spacings of 5/2 T are needed. Accordingly, every fifth phase output by divider 402 (each phase spaced apart by T/2, as reflected by the pulse train 408, provided here for clarity of illustration) is used as an input to the flops in chain 504. In this example, to produce the first phase from chain 504, the output of divider 502 is input to the first flop in chain 504, and this first flop is clocked by one of the eight phase outputs from divider 402, which is $\Phi_{B3}$. To produce the second phase output from chain 504, the second flop in chain 504 receives the output of the first flop and is clocked by the fifth phase after is $\Phi_{B3}$ output by divider 402, which is $\Phi_{B0}$. And this pattern is continued for all of the eight phases output from chain 504, which should be apparent from the waveforms 506 in FIG. 5.

According to certain aspects of the present embodiments, the lower-speed divider 502 and flip-flop delay chain 504 can be implemented with circuits which are relatively small and low-power (e.g. full-swing CMOS circuits) as compared to similar components (e.g. CML circuits) used in the conventional approaches shown in FIGS. 2 and 3. In these and other implementations, input capacitance and area can be reduced substantially (e.g. by approximately 40% in some implementations) as compared to the conventional approaches. Moreover, if other divide ratios are desired (e.g. divide-by-12, etc.), these are easily added in parallel with divider 502 and chain 504 using corresponding lower-speed dividers and delay chains at very low cost in terms of area and power.

Referring back to FIG. 5, in some cases, the output phases produced by chain 504 may not be 50% duty cycle, or any other desired duty cycle. For example, as can be seen in the waveform 506 for $\Phi_{out,0}$, the "high" portion is only 16 clock pulses of train 408, instead of 20 clock pulses which would be the case for a 50% duty cycle clock signal. To correct for this, the clocks can be delayed again through a set of flip-flops and their outputs can be logically ORed to produce a 50% duty cycle output.

Figure 6:
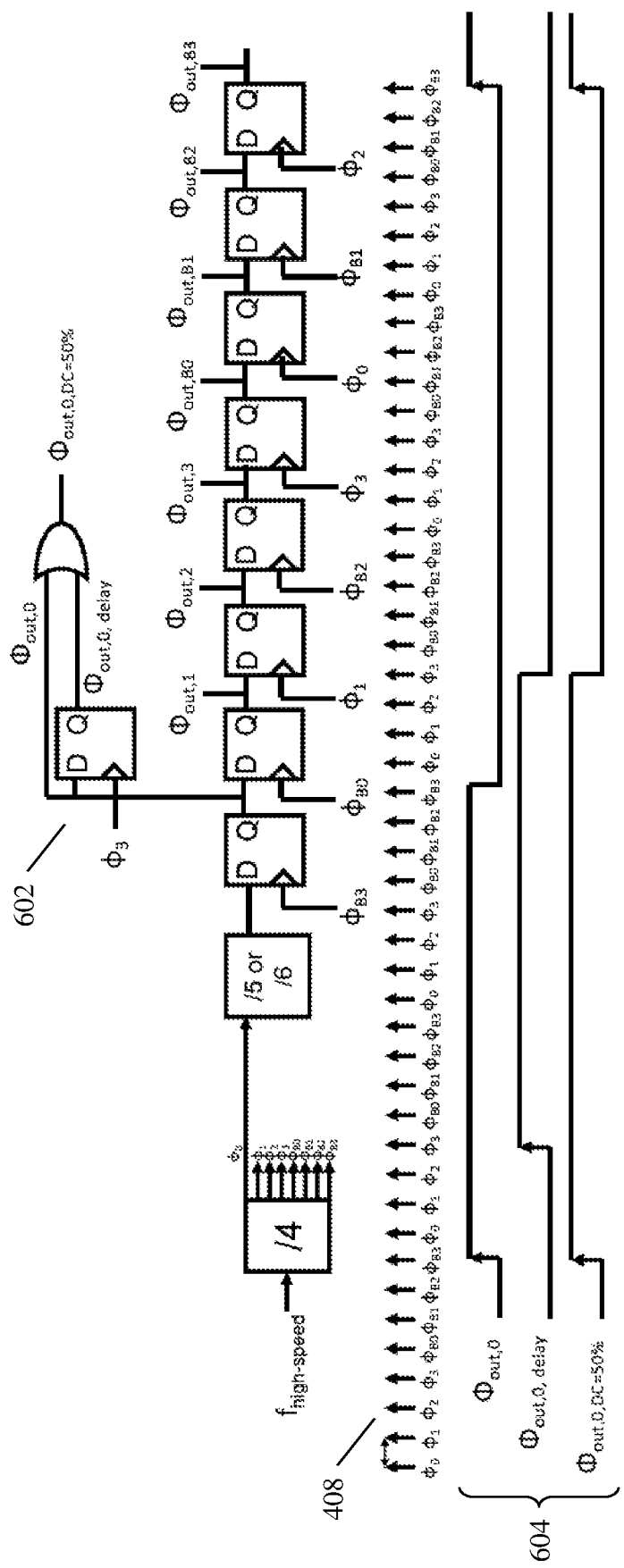
FIG. 6 is a block diagram and a timing diagram illustrating still further aspects of multiple clock generation according to embodiments.

FIG. 6 shows an example of the circuitry 602 required to correct the duty cycle for one output clock phase $\Phi_{out,0}$, however this circuitry could be repeated for the other phases as well. More particularly, as shown in FIG. 6, circuitry 602 includes an OR gate that produces a version of output clock phase $\Phi_{out,0}$, that has a 50% duty cycle, i.e. output clock phase $\Phi_{out,0,DC=50\%}$. To do this the OR gate receives the original output clock phase $\Phi_{out,0}$, and another signal generated from this original phase by a flop designated as $\Phi_{out,0,delay}$. Referring to the waveforms 604, the original output clock phase $\Phi_{out,0}$, has a duty cycle of less than 50%. With reference to pulse train 408, and as set forth above, output clock phase $\Phi_{out,0}$, is high for only 16 clock pulses of train 408, instead of 20 clock pulses. Accordingly, the signal $\Phi_{out,0,delay}$, is generated from original output clock phase $\Phi_{out,0}$, to have a high period that ends at the desired number of 20 pulses. As can be seen, this can be done by the flop in circuitry 602 being clocked by the input clock phase $\Phi_3$. The OR'd result of these two signals is shown by output clock phase $\Phi_{out,0,Dc=50\%}$, which is high for the proper number of 20 pulses so as to provide the correct duty cycle.

With reference to the embodiments shown in FIGS. 4 to 6, a flowchart illustrating an example methodology is provided in FIG. 7.

As shown in FIG. 7, the example methodology includes receiving a high-speed clock in 702. In 704, the high-speed clock is divided by a first ratio (e.g. a divide-by-4) to obtain a number of phases (e.g. 8) of a first divided clock signal (e.g. 8 phases of a clock signal having one-fourth the frequency of the high-speed clock, each separated by ½ of the period T of high-speed clock). It should be noted that the initial division can be performed by a high-speed divider such as 402 in FIG. 4. In 706, a single phase of the first divided clock signal is divided by a second ratio (e.g. a divide-by-5 such as 502) to produce a second divided clock signal (e.g. an output clock signal that is $1/20^{th}$ the frequency of the high-speed clock). As set forth above, the second divider can be a lower speed divider than the initial divider. In 708, the second divided clock signal and the other phases of the first divided clock signal are provided to phase generation circuitry (e.g. 504) to produce a desired number (e.g. 8) of phases of the second divided clock signal. As set forth above, the lower-speed divider used to produce the second divided clock signal and the phase generation circuitry to produce the desired number of phases thereof can be implemented with full-swing CMOS circuits which are relatively small and low-power as compared to similar components used in the conventional approaches shown in FIGS. 2 and 3. Finally, as shown by 710, the phases of the first and second divided clock signals can be provided to sampling circuitry, for example in a SerDes transceiver. It should be noted that the first and second divided clock signals may not actually be provided at the same time, but only one at a time, such as via a multiplexer as shown in FIG. 3. It should be further appreciated that the some of the produced clock signals can also be used in the digital loop to maintain proper phase lock.

Although the present embodiments have been particularly described with reference to preferred examples thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A serializer-deserializer transceiver, comprising:
an initial divider that receives an input clock having a first frequency, wherein the initial divider comprises a plurality of series-interconnected latches all clocked by the input clock, and wherein each of the latches produces a respective one of a plurality of first clocks, each of the first clocks having a second frequency that is a first integer fraction of the first frequency and being spaced apart in time from each other by a first phase spacing that less than one period of the first frequency by operation of the series-interconnected latches all being clocked by the input clock; and
a subsequent divider that is coupled to receive and combine the plurality of first clocks from the plurality of series-interconnected latches of the initial divider to thereby produce a plurality of second clocks, each of the second clocks having a third frequency that is a second integer fraction of the second frequency.

2. The device of claim 1, wherein the plurality of first clocks are generated based on rising and falling edges of the input clock, and wherein the first phase spacing is one-half of a period of the input clock.

3. The device of claim 1, wherein a number of the latches is the same as a number of the plurality of first clocks.

4. The device of claim 1, wherein the subsequent divider comprises a chain of flip-flops, each of the flip-flops being clocked by a separate one of the plurality of first clocks.

5. The device of claim 4, wherein a number of the flip-flops is the same as a number of the plurality of second clocks.

6. The device of claim 4, wherein the subsequent divider further includes a divider that divides one of the first plurality of clocks to produce an output signal that is provided to a D-input of the chain of flip-flops.

7. The device of claim 1, further comprising circuitry to cause the plurality of second clocks to have a predetermined duty cycle.

8. The device of claim 7, wherein the circuitry includes another flip-flop that receives an output of one of the chain of flip-flops and generates one of the plurality of second clocks, the another flip-flop being clocked by a selected one of the plurality of first clocks.

9. A method for generating sampling clocks in a serializer-deserializer transceiver, comprising:
receiving an input clock having a first frequency;
initially dividing the input clock to simultaneously produce a plurality of first clocks, each of the first clocks having a second frequency that is a first integer fraction of the first frequency and being spaced apart in time from each other by a first phase spacing that less than one period of the first frequency, wherein initially dividing comprises obtaining each of the plurality of first clocks from a respective one of a series of interconnected latches, wherein all of the latches are clocked by the input clock; and
subsequently producing, by receiving and combining the plurality of first clocks from the series of interconnected latches of the initial divider, a plurality of second clocks, each of the second clocks having a third frequency that is a second integer fraction of the second frequency.

10. The method of claim 9, wherein the plurality of first clocks are generated based on rising and falling edges of the input clock, and wherein the first phase spacing is one-half of a period of the input clock.

11. The method of claim 9, wherein a number of the latches is the same as a number of the plurality of first clocks.

12. The method of claim 9, wherein subsequently producing comprises obtaining the second plurality of clocks from a chain of flip-flops, each of the flip-flops being clocked by a separate one of the plurality of first clocks.

13. The method of claim 12, wherein a number of the flip-flops is the same as a number of the plurality of second clocks.

14. The method of claim 12, wherein subsequently producing further includes dividing one of the plurality of clocks to produce an output signal that is provided to a D-input of the chain of flip-flops.

15. The method of claim 9, further comprising causing the plurality of second clocks to have a predetermined duty cycle.

16. The device of claim 1, further comprising samplers that receive the plurality of second clocks and input data and that sample the input data at times defined by the plurality of second clocks.

17. The method of claim 9, further comprising:
receiving, by a sampler, the plurality of second clocks and input data; and
sampling, by the sampler, the input data at times defined by the plurality of second clocks.

* * * * *